US012642071B2

(12) United States Patent
Sharma et al.

(10) Patent No.: US 12,642,071 B2
(45) Date of Patent: May 26, 2026

(54) SCALABLE ARCHITECTURE FOR MULTI-DIE SEMICONDUCTOR PACKAGES

(71) Applicant: Intel Corporation, Santa Clara, CA (US)

(72) Inventors: Abhishek Anil Sharma, Portland, OR (US); Wilfred Gomes, Portland, OR (US); Pushkar Ranade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 17/708,417

(22) Filed: Mar. 30, 2022

(65) Prior Publication Data

US 2023/0317561 A1 Oct. 5, 2023

(51) Int. Cl.
| | |
|---|---|
| *H10W 20/20* | (2026.01) |
| *H10B 12/00* | (2023.01) |
| *H10W 70/60* | (2026.01) |
| *H10W 70/65* | (2026.01) |
| *H10W 90/00* | (2026.01) |
| *H10W 72/00* | (2026.01) |
| *H10W 90/20* | (2026.01) |

(52) U.S. Cl.
CPC ............ *H10W 20/20* (2026.01); *H10B 12/50* (2023.02); *H10W 70/611* (2026.01); *H10W 70/65* (2026.01); *H10W 90/00* (2026.01); *H10W 72/823* (2026.01); *H10W 90/297* (2026.01)

(58) Field of Classification Search
CPC ............... H01L 23/481; H01L 23/5386; H01L 25/0652; H01L 25/0657
See application file for complete search history.

(56) References Cited

U.S. PATENT DOCUMENTS

| | | | |
|---|---|---|---|
| 9,734,079 B2 | 8/2017 | Feekes et al. | |
| 10,249,597 B2 * | 4/2019 | Pappu | .................... G11C 5/025 |

(Continued)

FOREIGN PATENT DOCUMENTS

| | | | | |
|---|---|---|---|---|
| CN | 107710237 A | * | 2/2018 | ............. G06N 3/045 |
| CN | 113169157 A | * | 7/2021 | ......... H01L 23/5385 |

(Continued)

OTHER PUBLICATIONS

U.S. Appl. No. 17/708,398, filed Mar. 30, 2022, entitled "Providing Fine Grain Access to Package Memory," by Abhishek Anil Sharma, et al., 22 pgs.

(Continued)

*Primary Examiner* — Laura M Menz
(74) *Attorney, Agent, or Firm* — NICHOLSON DE VOS WEBSTER & ELLIOTT LLP

(57) ABSTRACT

In one embodiment, an apparatus includes a first die adapted on a second die. The first die may have a plurality of cores, each of the plurality of cores associated with a first plurality of through silicon vias (TSVs), and the second die may have dynamic random access memory (DRAM). The DRAM of the second die may have a plurality of local portions, each of the plurality of local portions associated with a second plurality of TSVs, where each of at least some of the plurality of cores are directly coupled to a corresponding local portion of the DRAM by the corresponding first and second plurality of TSVs. Other embodiments are described and claimed.

20 Claims, 8 Drawing Sheets

(56) References Cited

U.S. PATENT DOCUMENTS

| | | | | |
|---|---|---|---|---|
| 10,452,971 | B2 * | 10/2019 | Chung | G06N 3/0464 |
| 10,990,530 | B1 | 4/2021 | Chanler et al. | |
| 11,126,430 | B2 * | 9/2021 | Venkataraghavan | G06F 7/76 |
| 11,158,621 | B2 * | 10/2021 | Zhong | H01L 25/105 |
| 11,599,299 | B2 * | 3/2023 | DeLaCruz | G06F 3/0655 |
| 11,699,681 | B2 * | 7/2023 | Sharma | G11C 5/04 |
| | | | | 257/686 |
| 11,901,347 | B2 * | 2/2024 | Gomes | H01L 25/0657 |
| 11,989,553 | B2 * | 5/2024 | Tepper | H10D 88/00 |
| 12,001,697 | B2 * | 6/2024 | Vogelsang | G11C 11/40611 |
| 12,210,873 | B2 * | 1/2025 | Nurvitadhi | G06F 30/343 |
| 12,271,306 | B2 * | 4/2025 | Gomes | G06F 12/0802 |
| 12,399,636 | B2 * | 8/2025 | Vogelsang | G11C 11/408 |
| 12,450,178 | B2 * | 10/2025 | Ali | G06F 13/1657 |
| 2011/0204917 | A1 * | 8/2011 | O'Neill | H10D 89/10 |
| | | | | 326/38 |
| 2013/0141858 | A1 | 6/2013 | Pyeon | |
| 2015/0348613 | A1 * | 12/2015 | Vogelsang | G11C 11/4093 |
| | | | | 365/51 |
| 2016/0379108 | A1 * | 12/2016 | Chung | G06N 3/0464 |
| | | | | 706/27 |
| 2016/0379109 | A1 * | 12/2016 | Chung | G06N 3/063 |
| | | | | 706/26 |
| 2018/0096971 | A1 * | 4/2018 | Pappu | G11C 5/025 |
| 2018/0096979 | A1 * | 4/2018 | Pappu | G11C 29/78 |
| 2019/0043833 | A1 * | 2/2019 | Kwon | H01L 23/3135 |
| 2019/0189188 | A1 * | 6/2019 | Hush | G11C 11/4076 |
| 2019/0189189 | A1 * | 6/2019 | Hush | G11C 11/4096 |
| 2019/0385662 | A1 * | 12/2019 | Hush | G11C 11/4087 |
| 2020/0135700 | A1 * | 4/2020 | Sharma | G11C 5/04 |
| 2020/0176431 | A1 * | 6/2020 | Zhong | H01L 25/105 |
| 2020/0279842 | A1 * | 9/2020 | Zhong | H01L 25/105 |
| 2020/0357766 | A1 * | 11/2020 | Su | H01L 23/3142 |
| 2021/0074695 | A1 | 3/2021 | Gomes et al. | |
| 2021/0193666 | A1 * | 6/2021 | Gomes | G11C 11/404 |
| 2021/0225808 | A1 | 7/2021 | Bohr et al. | |
| 2021/0375849 | A1 | 12/2021 | Gomes et al. | |
| 2022/0137843 | A1 * | 5/2022 | Vogelsang | G06F 3/0634 |
| | | | | 711/106 |
| 2023/0244485 | A1 * | 8/2023 | Nurvitadhi | G06F 9/3004 |
| | | | | 712/222 |
| 2023/0315334 | A1 * | 10/2023 | Sharma | G06F 3/0656 |
| | | | | 711/154 |
| 2023/0317140 | A1 * | 10/2023 | Sharma | H03K 19/018521 |
| | | | | 365/230.06 |
| 2023/0317561 | A1 * | 10/2023 | Sharma | H01L 25/18 |
| 2023/0318825 | A1 * | 10/2023 | Sharma | G06F 21/72 |
| | | | | 380/278 |
| 2023/0376234 | A1 * | 11/2023 | DeLaCruz | G06F 3/0655 |
| 2023/0418508 | A1 * | 12/2023 | Sharma | G06F 3/0655 |
| 2023/0418604 | A1 * | 12/2023 | Sharma | G06F 9/5016 |
| 2024/0211400 | A1 * | 6/2024 | Diamand | G06F 12/0815 |
| 2024/0215222 | A1 * | 6/2024 | Sharma | H10B 12/315 |
| 2024/0222347 | A1 * | 7/2024 | Suthram | H01L 25/18 |
| 2024/0354014 | A1 * | 10/2024 | Vogelsang | G11C 11/408 |
| 2024/0387495 | A1 * | 11/2024 | Lee | H01L 25/18 |
| 2024/0403235 | A1 * | 12/2024 | Ali | G11C 5/04 |
| 2025/0104179 | A1 * | 3/2025 | Koker | G06F 13/4027 |
| 2025/0200811 | A1 * | 6/2025 | Junkins | G06T 9/00 |

FOREIGN PATENT DOCUMENTS

| | | | | | |
|---|---|---|---|---|---|
| CN | 107710237 | B | * | 8/2021 | G06N 3/063 |
| CN | 115706087 | A | * | 2/2023 | H01L 23/5386 |
| CN | 117397388 | A | * | 1/2024 | G06F 15/7807 |
| DE | 102022115648 | A1 | * | 12/2022 | G06F 9/30123 |
| EP | 3916781 | A1 | * | 12/2021 | H01L 23/5283 |
| EP | 4064059 | A1 | * | 9/2022 | G11C 5/02 |
| EP | 4109391 | A1 | * | 12/2022 | G06F 12/0855 |
| EP | 4135032 | A1 | * | 2/2023 | H01L 23/5386 |
| EP | 4471770 | A1 | * | 12/2024 | G06F 15/7807 |
| KR | 20240004301 | A | * | 1/2024 | H01L 25/18 |
| WO | WO-2017003837 | A1 | * | 1/2017 | G06N 3/045 |
| WO | WO-2020112504 | A1 | * | 6/2020 | H01L 23/5385 |
| WO | WO-2022271245 | A1 | * | 12/2022 | G06T 1/20 |
| WO | WO-2024086092 | A1 | * | 4/2024 | H01L 25/0657 |

OTHER PUBLICATIONS

U.S. Appl. No. 17/850,044, filed Jun. 27, 2022, entitled "Reconfigurable Vector Processing in a Memory," by Abhishek Anil Sharma, et al., 31 pgs.

U.S. Appl. No. 17/850,090, filed Jun. 27, 2022, entitled "Performing Distributed Processing Using Distributed Memory," by Abhishek Anil Sharma, et al., 29 pgs.

* cited by examiner

SCALABLE ARCHITECTURE FOR MULTI-DIE SEMICONDUCTOR PACKAGES

BACKGROUND

Modern semiconductor packaging techniques often seek to increase the number of die-to-die connections. Conventional techniques implement a so-called 2.5D solution, utilizing a silicon interposer and through silicon vias (TSVs) to connect die using interconnects with a density and speed typical for integrated circuits in a minimal footprint. However there are complexities in layout and manufacturing techniques. Further, when seeking to embed a memory die in a common package, there can be latencies owing to separation between consuming resources and the memory die as they may be separated from each other by adaptation on different portions of the silicon interposer. Furthermore, customization of a given overall package design is often required to accommodate different market segments, increasing design times and costs, and reducing mass production techniques.

DETAILED DESCRIPTION

In various embodiments, an integrated circuit (IC) package may include multiple dies in stacked relation. More particularly in embodiments, at least one compute die may be adapted on a memory die in a manner to provide fine-grained memory access by way of localized dense connectivity between compute elements of the compute die and localized banks (or other local portions) of the memory die. This close physical coupling of compute elements to corresponding local portions of the memory die enables the compute elements to locally access local memory portions, in contrast to a centralized memory access system that is conventionally implemented via a centralized memory controller.

Figure 1:
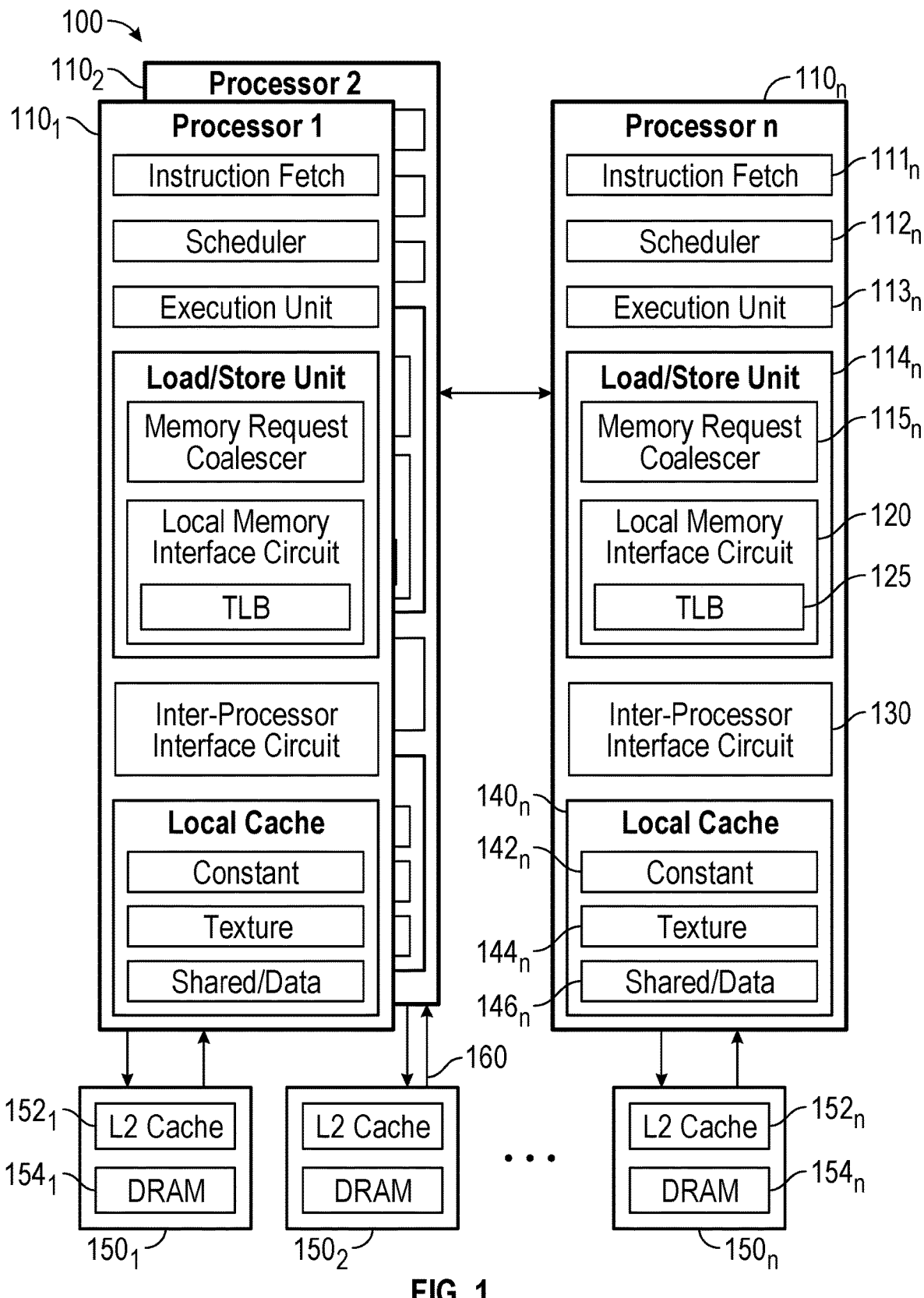
FIG. 1 is a block diagram of a package having memory tightly coupled with processing circuitry in accordance with an embodiment.

Referring now to FIG. 1, shown is a block diagram of a package having memory tightly coupled with processing circuitry in accordance with an embodiment. As shown in FIG. 1, package 100 includes a plurality of processors $110_1$-$110_n$. In the embodiment shown, processors 110 are implemented as streaming processors. However embodiments are not limited in this regard, and in other cases the processors may be implemented as general-purpose processing cores, accelerators such as specialized or fixed function units or so forth. As used herein, the term "core" refers generally to any type of processing circuitry that is configured to execute instructions, tasks and/or workloads, namely to process data.

In the embodiment of FIG. 1, processors 110 each individually couple directly to corresponding portions of a memory 150, namely memory portions $150_1$-$150_n$. As such, each processor 110 directly couples to a corresponding local portion of memory 150 without a centralized interconnection network therebetween. In one or more embodiments described herein, this direct coupling may be implemented by stacking multiple die within package 100. For example, processors 110 may be implemented on a first die and memory 150 may be implemented on at least one other die, where these dies may be stacked on top of each other, as will be described more fully below. By "direct coupling" it is meant that a processor (core) is physically in close relation to a local portion of memory in a non-centralized arrangement so that the processor (core) has access only to a given local memory portion and without communicating through a memory controller or other centralized controller.

As seen, each instantiation of processor 110 may directly couple to a corresponding portion of memory 150 via interconnects 160. Although different physical interconnect structures are possible, in many cases, interconnects 160 may be implemented by one or more of conductive pads, bumps or so forth. Each processor 110 may include TSVs that directly couple to TSVs of a corresponding local portion of memory 150. In such arrangements, interconnects 160 may be implemented as bumps or hybrid bonding or other bumpless technique.

Memory 150 may, in one or more embodiments, include a level 2 (L2) cache 152 and a dynamic random access memory (DRAM) 154. As illustrated, each portion of memory 150 may include one or more banks or other portions of DRAM 154 associated with a corresponding processor 110. In one embodiment, each DRAM portion 154 may have a width of at least 1024 words. Of course other widths are possible. Also while a memory hierarchy including both an L2 cache and DRAM is shown in FIG. 1, it is possible for an implementation to provide only DRAM 154 without presence of an L2 cache (at least within memory 150). This is so, as DRAM 154 may be configured to operate as a cache, as it may provide both spatial and temporal locality for data to be used by its corresponding processor 110. This is particularly so when package 100 is included in a system having a system memory (e.g., implemented as dual-inline memory modules (DIMMs) or other volatile or non-volatile memory). In other cases, such as a DRAM-less system, there may be multiple memory dies, including at least one die having local memory portions in accordance with an embodiment, and possibly one or more other memory die having conventional DRAM to act as at least a portion of a system memory. As an example, one memory die may be configured as a cache memory and another memory die may be configured as a system memory. In such DRAM-less system, DRAM 154 may be a system memory for the system in which package 100 is included.

With embodiments, package 100 may be implemented within a given system implementation, which may be any type of computing device that is a shared DRAM-less system, by using memory 150 as a flat memory hierarchy. Such implementations may be possible, given the localized dense connectivity between corresponding processors 110 and memory portions 150 that may provide for dense local access on a fine-grained basis. In this way, such implementations may rely on physically close connections to localized memories 150, rather than a centralized access mechanism, such as a centralized memory controller of a processor. Further, direct connection occurs via interconnects 160 without a centralized interconnection network.

Still with reference to FIG. 1, each processor 110 may include an instruction fetch circuit 111 that is configured to fetch instructions and provide them to a scheduler 112. Scheduler 112 may be configured to schedule instructions for execution on one or more execution circuits 113, which may include arithmetic logic units (ALUs) and so forth to perform operations on data in response to decoded instructions, which may be decoded in an instruction decoder, either included within processor 110 or elsewhere within an SoC or another processor.

As further shown in FIG. 1, processor 110 also may include a load/store unit 114 that includes a memory request coalescer 115. Load/store unit 114 may handle interaction with corresponding local memory 150. To this end, each processor 110 further may include a local memory interface circuit 120 that includes a translation lookaside buffer (TLB) 125. In other implementations local memory interface circuit 120 may be separate from load/store unit 114.

In embodiments herein, TLB 125 may be configured to operate on only a portion of an address space, namely that portion associated with its corresponding local memory 150. To this end, TLB 125 may include data structures that are configured for only such portion of an entire address space. For example, assume an entire address space is 64 bits corresponding to a 64-bit addressing scheme. Depending upon a particular implementation and sizing of an overall memory and individual memory portions, TLB 125 may operate on somewhere between approximately 10 and 50 bits.

Still with reference to FIG. 1, each processor 110 further includes a local cache 140 which may be implemented as a level 1 (L1) cache. Various data that may be frequently and/or recently used within processor 110 may be stored within local cache 140. In the illustration of FIG. 1, exemplary specific data types that may be stored within local cache 140 include constant data 142, texture data 144, and shared/data 146. Note that such data types may be especially appropriate when processor 110 is implemented as a graphics processing unit (GPU). Of course other data types may be more appropriate for other processing circuits, such as general-purpose processing cores or other specialized processing units.

Still referring to FIG. 1, each processor 110 may further include an inter-processor interface circuit 130. Interface circuit 130 may be configured to provide communication between a given processor 110 and its neighboring processors, e.g., a nearest neighbor on either side of processor 130. Although embodiments are not limited in this regard, in one or more embodiments inter-processor interface circuit 130 may implement a message passing interface (MPI) to provide communication between neighboring processors. While shown at this high level in the embodiment of FIG. 1, many variations and alternatives are possible. For example, more dies may be present in a given package, including multiple memory dies that form one or more levels of a memory hierarchy and additional compute, interface, and/or controller dies.

Figure 2:
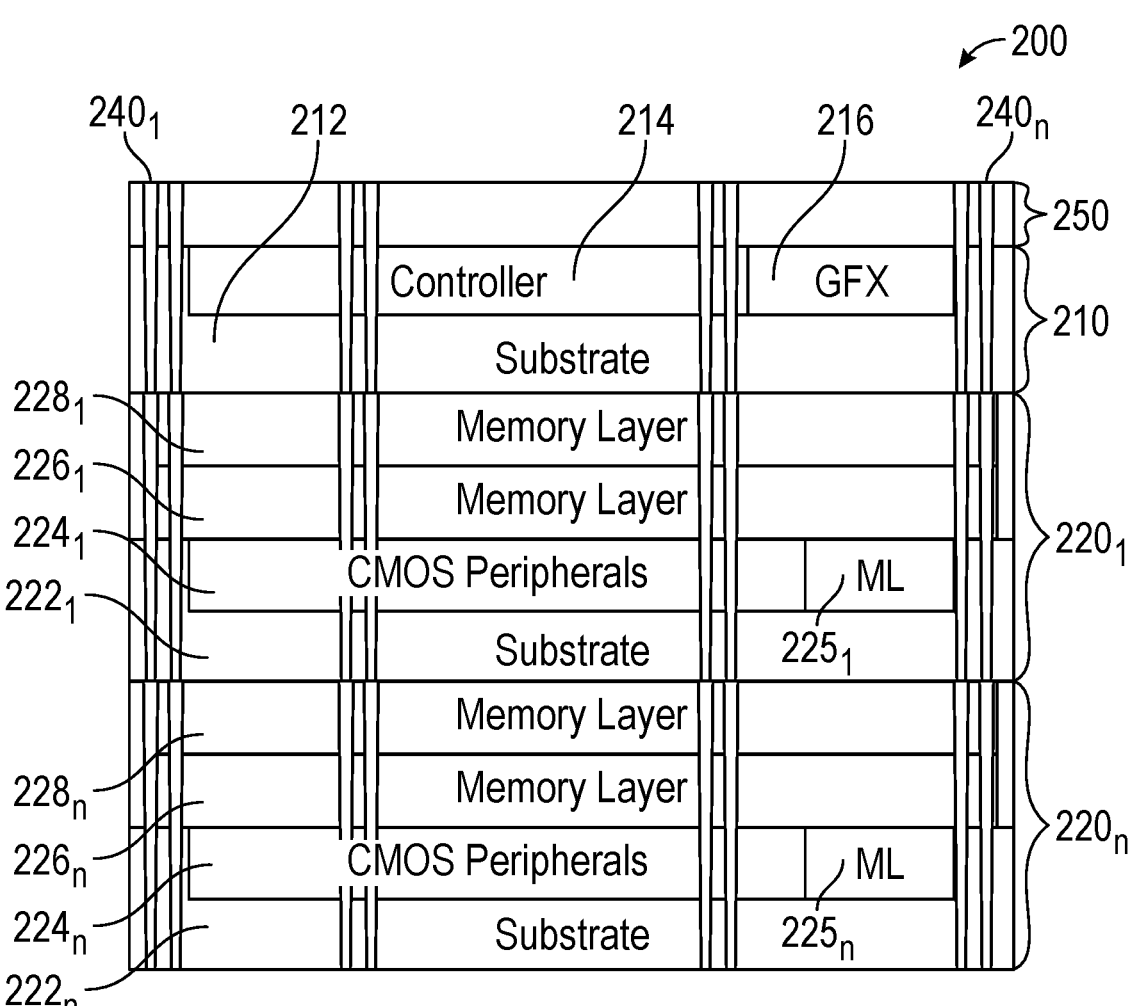
FIG. 2 is a cross sectional view of a package in accordance with an embodiment.

Referring now to FIG. 2, shown is a cross sectional view of a package in accordance with an embodiment. As shown in FIG. 2, package 200 is a multi-die package including a set of stacked die, namely a first die 210, which may be a compute die and multiple memory die $220_1$ and $220_2$. With this stacked arrangement, compute die 210 may be stacked above memory die 220 such that localized dense connectivity is realized between corresponding portions of memory die 220 and compute die 210. As further illustrated, a package substrate 250 may be present onto which the stacked dies may be adapted. In an embodiment, compute die 210 may be adapted at the top of the stack to improve cooling.

As further illustrated in FIG. 2, physical interconnection between circuitry present on the different die may be realized by TSVs $240_1$-$240_n$ (each of which may be formed of independent TSVs of each die). In this way, individual memory cells of a given portion may be directly coupled to circuitry present within compute die 210. Note further that in FIG. 2, in the cross-sectional view, only circuitry of a single processing circuit and a single memory portion is illustrated. As shown, with respect to compute die 210, a substrate 212 is provided in which controller circuitry 214 and graphics circuitry 216 is present.

With reference to memory die 220, a substrate 222 is present in which complementary metal oxide semiconductor (CMOS) peripheral circuitry 224 may be implemented, along with memory logic (ML) 225, which may include localized memory controller circuitry and/or cache controller circuitry. In certain implementations, CMOS peripheral circuitry 224 may include encryption/decryption circuitry, in-memory processing circuitry or so forth. As further illustrated, each memory die 220 may include multiple layers of memory circuitry. In one or more embodiments, there may be a minimal distance between CMOS peripheral circuitry 224 and logic circuitry (e.g., controller circuitry 214 and graphics circuitry 216) of compute die 210, such as less than one micron.

As shown, memory die 220 may include memory layers 226, 228. While shown with two layers in this example, understand that more layers may be present in other implementations. In each layer, a plurality of bit cells may be provided, such that each portion of memory die 220 provides a locally dense full width storage capacity for a corresponding locally coupled processor. Note that memory die 220 may be implemented in a manner in which the memory circuitry of layers 226, 228 may be implemented with backend of line (BEOL) techniques. While shown at this high level in FIG. 2, many variations and alternatives are possible.

Figure 3:
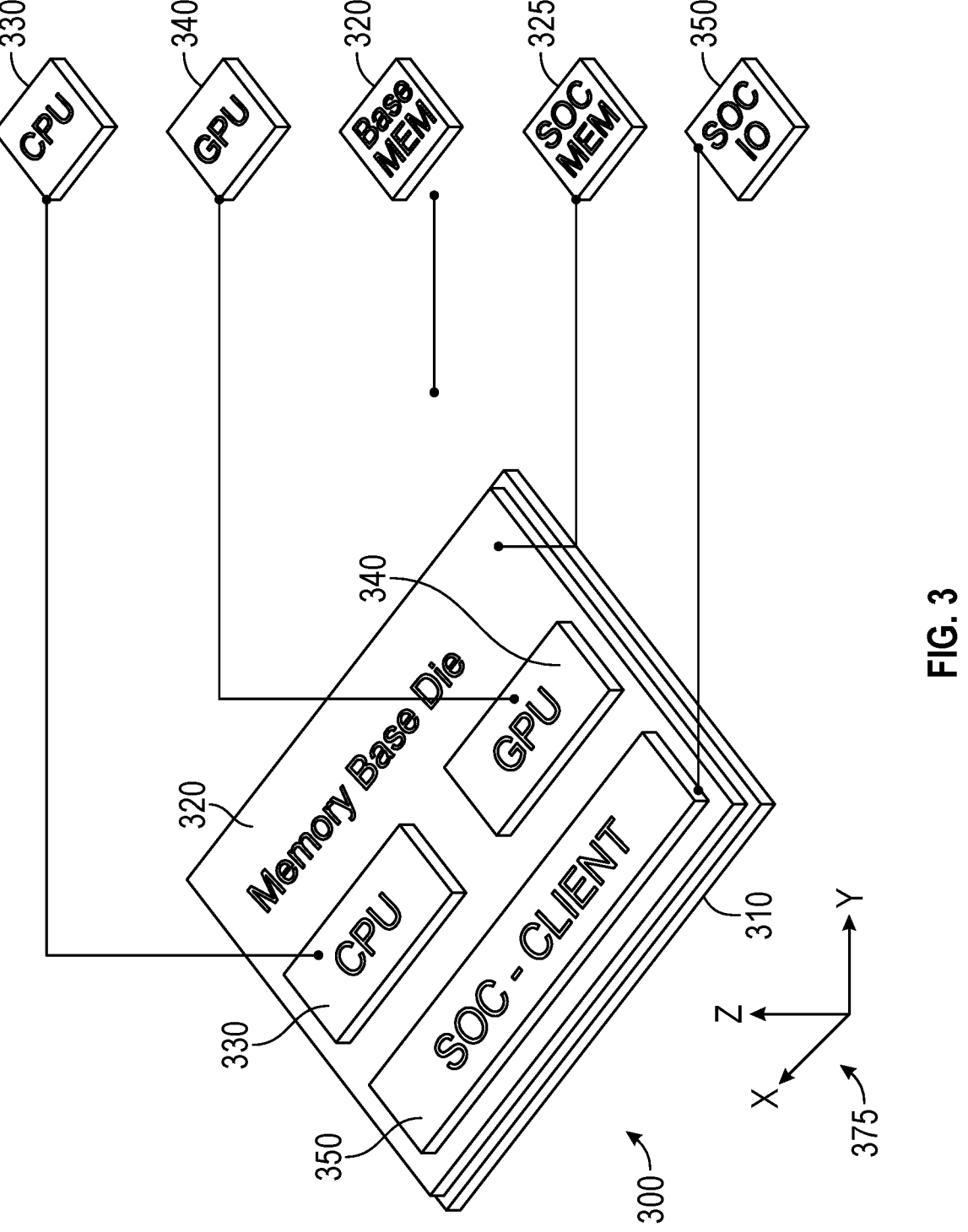
FIG. 3 is a block diagram of a scalable integrated circuit package in accordance with an embodiment.

Referring now to FIG. 3, shown is a block diagram of a scalable integrated circuit (IC) package in accordance with an embodiment. As shown in FIG. 3, package 300 is shown in an opened state; that is, without an actual package adapted about the various circuitry present. In the high level shown in FIG. 3, package 300 is implemented as a multi-die package having a plurality of dies adapted on a substrate 310. Substrate 310 may be a glass or sapphire substrate (to support wide bandwidth with low parasitics) and may, in some cases, include interconnect circuitry to couple various dies within package 300 and to further couple to components external to package 300.

In the illustration of FIG. 3, a memory die 320 is adapted on substrate 310. In embodiments herein, memory die 320 may be a DRAM that is arranged according to an embodiment herein, namely with local portions that each may have a full width of data, e.g., 1024 words. In this way, each of the local portions may directly and locally couple with a corresponding local processor such as a general-purpose or specialized processing core with which it is associated (such as described above with regard to FIGS. 1 and 2).

In one or more embodiments, each local portion may be configured as an independent memory channel, e.g., as a double data rate (DDR) memory channel. In some embodiments, these DDR channels of memory die 320 may be an embedded DRAM (eDRAM) that replaces a conventional package-external DRAM, e.g., formed of conventional dual inline memory modules (DIMMs). While not shown in the high level view of FIG. 3, memory die 320 may further include an interconnection network, such as at least a portion of a global interconnect network that can be used to couple together different dies that may be adapted above memory die 320.

As further shown in FIG. 3, multiple dies may be adapted above memory die 320. As shown, a central processing unit (CPU) die 330, a graphics (graphics processing unit (GPU)) die 340, and a SoC die 350 all may be adapted on memory die 320. FIG. 3 further shows in inset these disaggregated dies, prior to adaptation in package 300. CPU die 330 and GPU die 340 may include a plurality of general-purpose processing cores and graphics processing cores, respectively. In some use cases, instead of a graphics die, another type of specialized processing unit (generically referred to as an "XPU") may be present. Regardless of the specific compute dies present, each of these cores may locally and directly couple to a corresponding portion of the DRAM of memory die 320, e.g., by way of TSVs, as discussed above. In addition, CPU die 330 and GPU die 340 may communicate via interconnect circuitry (e.g., a stitching fabric or other interconnection network) present on or within memory die 320. Similarly, additional circuitry of an SoC, including interface circuitry to interface with other ICs or other components of a system may occur via circuitry of SoC die 350.

While shown with a single CPU die and single GPU die, in other implementations multiple ones of one or both of CPU and GPU dies may be present. More generally, different numbers of CPU and XPU dies (or other heterogenous dies) may be present in a given implementation.

Package 300 may be appropriate for use in relatively small computing devices such as smartphones, tablets, embedded systems and so forth. As discussed, with the ability to provide scalability by adding multiple additional processing dies, packages in accordance with embodiments can be used in these and larger more complex systems.

Further while shown with this particular implementation in FIG. 3, in some cases one or more additional memory dies configured with local DRAM portions similar to memory die 320 may be present. It is also possible for one or more of these additional memory dies to be implemented as conventional DRAM, to avoid the need for package-external DRAM.

Thus as shown in the inset of FIG. 3, an additional memory die 325 may take the form of a conventional DRAM. In such an implementation, memory die 320 may be managed to operate as at least one level of a cache memory hierarchy, while memory die 325 acts as a system memory, providing higher storage capacity. Depending on implementation, memory die 320 may be adapted on memory die 325, which is thus sandwiched between memory die 320 and substrate 310. While shown at this high level in the embodiment of FIG. 3, many variations and alternatives are possible. For example, as shown with reference to X-Y-Z coordinate system 375, package 300 can be extended in each of 3 dimensions to accommodate larger die footprints, as well as to provide additional dies in a stacked arrangement.

Figure 4:
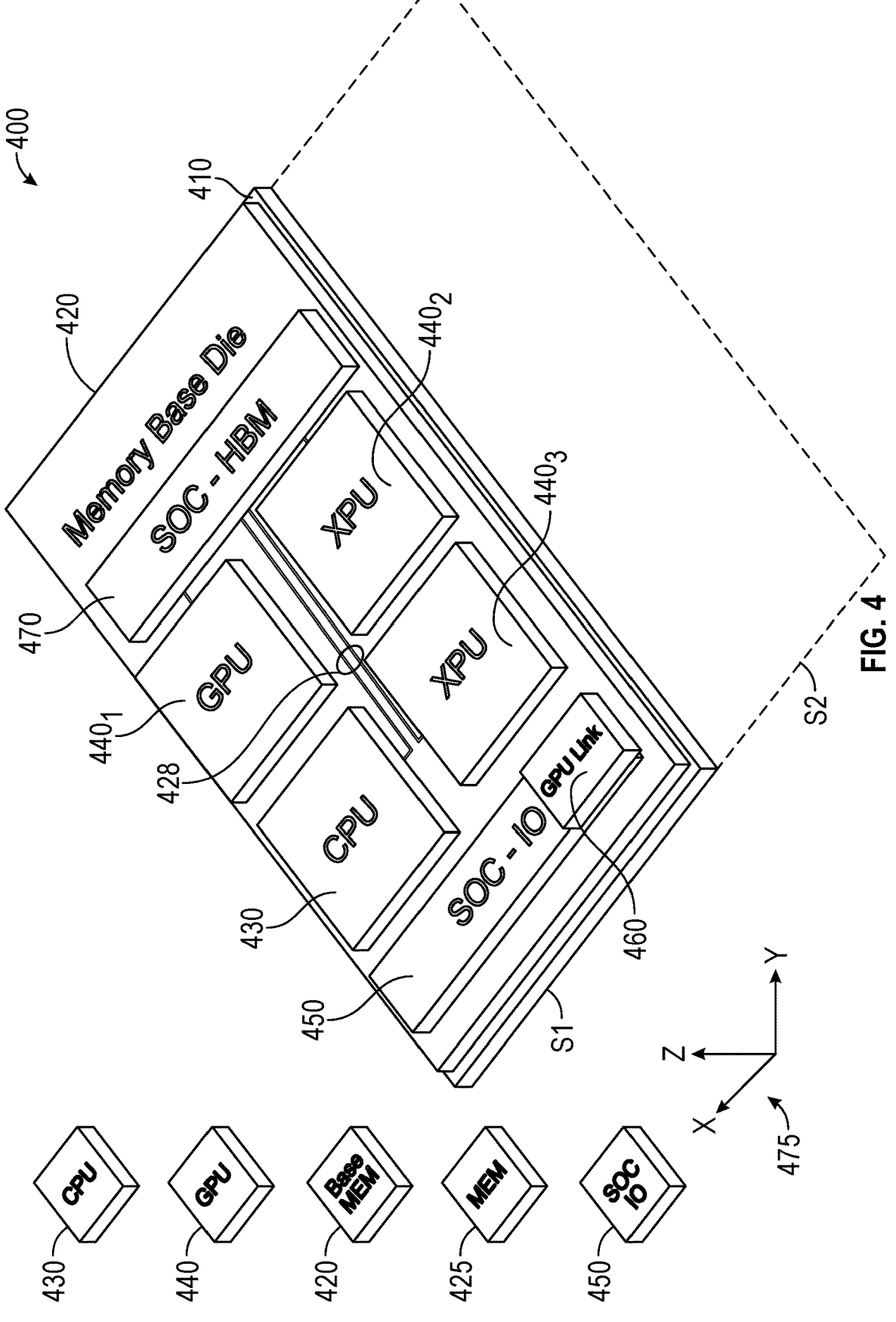
FIG. 4 is a block diagram of a scalable package in accordance with another embodiment.

Additional dies may be adapted within a package in accordance with other embodiments. Referring now to FIG. 4, shown is a block diagram of a package in accordance with another embodiment. In FIG. 4, multi-die package 400 includes a similar stacked arrangement of dies, including substrate 410, memory die 420 and additional die adapted on memory die 420. Since similar dies may be present in the embodiment of FIG. 4 as in the FIG. 3 embodiment, the same numbering scheme is used (of the "400" series, instead of the "300" series of FIG. 3).

However in the embodiment of FIG. 4, package 400 includes additional dies adapted on memory die 420. As shown, in addition to CPU die 430, three additional dies 440$_{1-3}$ are present. More specifically, die 440$_1$ is a GPU die and dies 440$_{2-3}$ are XPU dies. As with the above discussion, each die 440 may locally couple to corresponding local portions of DRAM of a memory die 420 by way of TSVs. In this way, individual processing cores within each of dies 440 may be locally coupled with corresponding local memory. And, as shown in FIG. 4, memory die 420 may include an interconnection network 428 (or other switching or stitching fabric) that may be used to couple together two or more of the dies adapted on memory die 420. Note that interconnect network 428 may be included on and/or within memory die 420.

Still with reference to FIG. 4, additional SoC dies may be present, including an SoC die 470 which may include memory controller circuitry that can interface with a high bandwidth memory (HBM) that is external to package 400. In addition, multiple interface die, including an SoC interface die 450 and a graphics interface die 460, may be present, which may provide interconnection between various dies within package 400 and external components.

As with the above discussion of FIG. 3, one or more additional memory die (e.g., memory die 425 shown in the inset) may be stacked within the package arrangement. Such additional memory die may include one or more dies including DRAM configured with local portions and interconnection circuitry as with memory die 420, and/or conventional DRAM. In this way, package 400 may be used in larger, more complex systems, including high end client computing devices, server computers, or other data center equipment.

Still further, understand that package 400 may represent, with respect to memory die 420, a single stamping (51) or base die arrangement of memory circuitry including multiple local memory portions and corresponding interconnect circuitry. This single stamping may be one of multiple such stampings (representative additional stamping S2 is shown in dashed form in FIG. 4) that can be fabricated on a semiconductor wafer, which is then diced into multiple iterations of this base memory die, where each die has the same stamping, namely, the same circuitry.

It is also possible to provide a multi-die package that is the size of an entire semiconductor wafer (or at least substantially wafer-sized) (e.g., a typical 300 millimeter (mm) semiconductor wafer). With such arrangement, a single package may include multiple stampings of a base memory die (or multiple such dies). In turn, each of the stampings may have adapted thereon multiple processing dies and associated circuitry. As an example, assume that base memory die 420 of FIG. 4 has first dimensions to represent a single stamping. Extending this stamping in the x and y directions for an entire wafer size may enable a given plurality of stampings to be present. In this way, a package having a substantially wafer-sized memory base layer may include a given number of iterations of the die configuration shown in FIG. 4. Thus with embodiments, scalability may be realized in all of x, y, and z dimensions of X-Y-Z coordinate system 475.

Packages in accordance with embodiments can be incorporated in many different system types, ranging from small portable devices such as a smartphone, laptop, tablet or so forth, to larger systems including client computers, server computers and datacenter systems.

Figure 5:
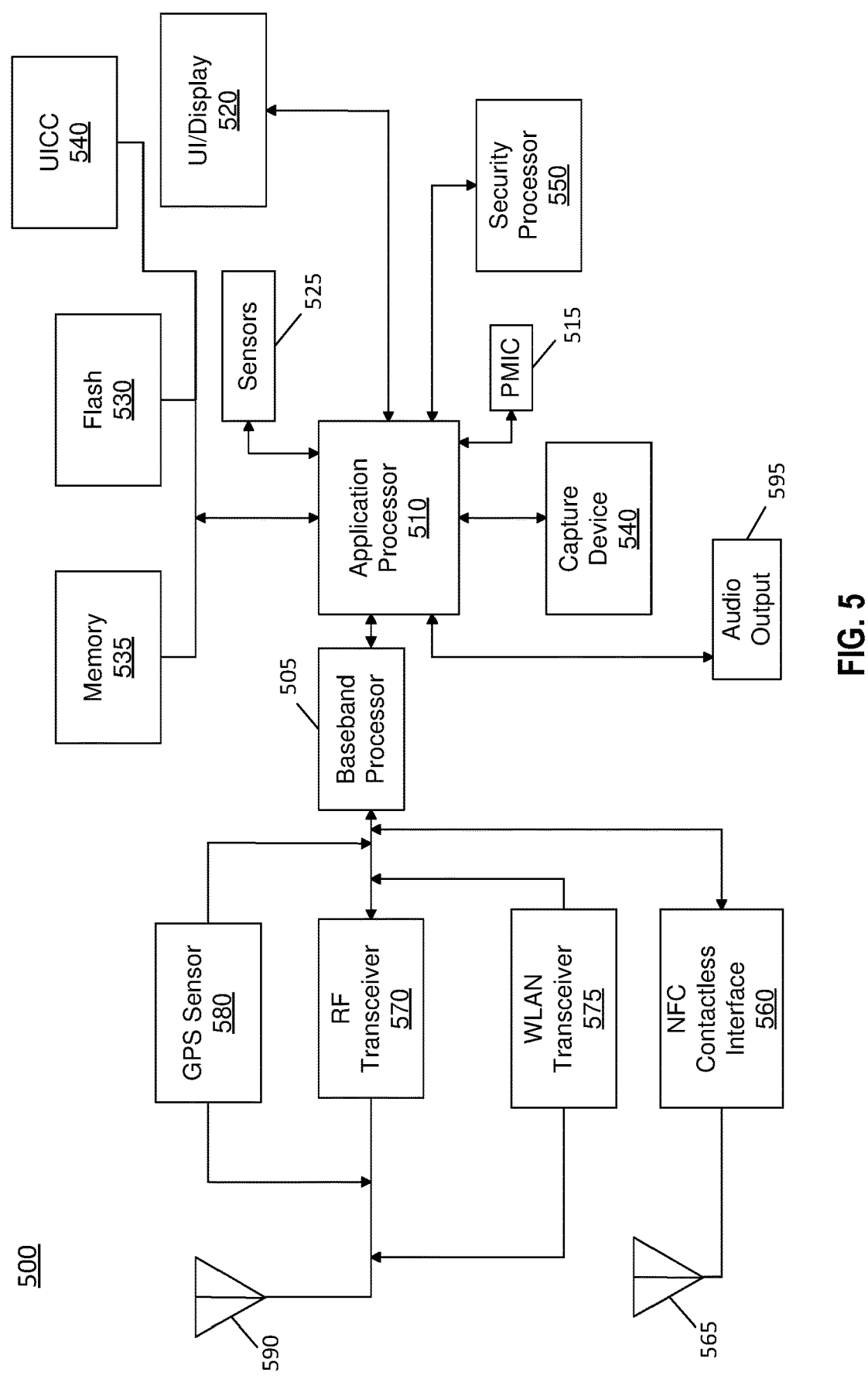
FIG. 5 is a block diagram of an example system with which embodiments can be used.

Referring now to FIG. 5, shown is a block diagram of an example system with which embodiments can be used. As seen, system 500 may be a smartphone or other wireless communicator. A baseband processor 505 is configured to perform various signal processing with regard to communication signals to be transmitted from or received by the system. In turn, baseband processor 505 is coupled to an application processor 510, which may be a main CPU of the system to execute an OS and other system software, in addition to user applications such as many well-known social media and multimedia apps. Application processor 510 may further be configured to perform a variety of other computing operations for the device.

In turn, application processor 510 can couple to a user interface/display 520, e.g., a touch screen display. In addition, application processor 510 may couple to a memory system including a non-volatile memory, namely a flash memory 530 and a system memory, namely a dynamic random access memory (DRAM) 535. In embodiments herein, a package may include multiple dies including at least processor 510 and DRAM 535, which may be stacked and configured as described herein. As further seen, application processor 510 further couples to a capture device 540 such as one or more image capture devices that can record video and/or still images.

Still referring to FIG. 5, a universal integrated circuit card (UICC) 540 comprising a subscriber identity module and possibly a secure storage and cryptoprocessor is also coupled to application processor 510. System 500 may further include a security processor 550 that may couple to application processor 510. A plurality of sensors 525 may couple to application processor 510 to enable input of a variety of sensed information such as accelerometer and other environmental information. An audio output device 595 may provide an interface to output sound, e.g., in the form of voice communications, played or streaming audio data and so forth.

As further illustrated, a near field communication (NFC) contactless interface 560 is provided that communicates in a NFC near field via an NFC antenna 565. While separate antennae are shown in FIG. 5, understand that in some implementations one antenna or a different set of antennae may be provided to enable various wireless functionality.

Figure 6:
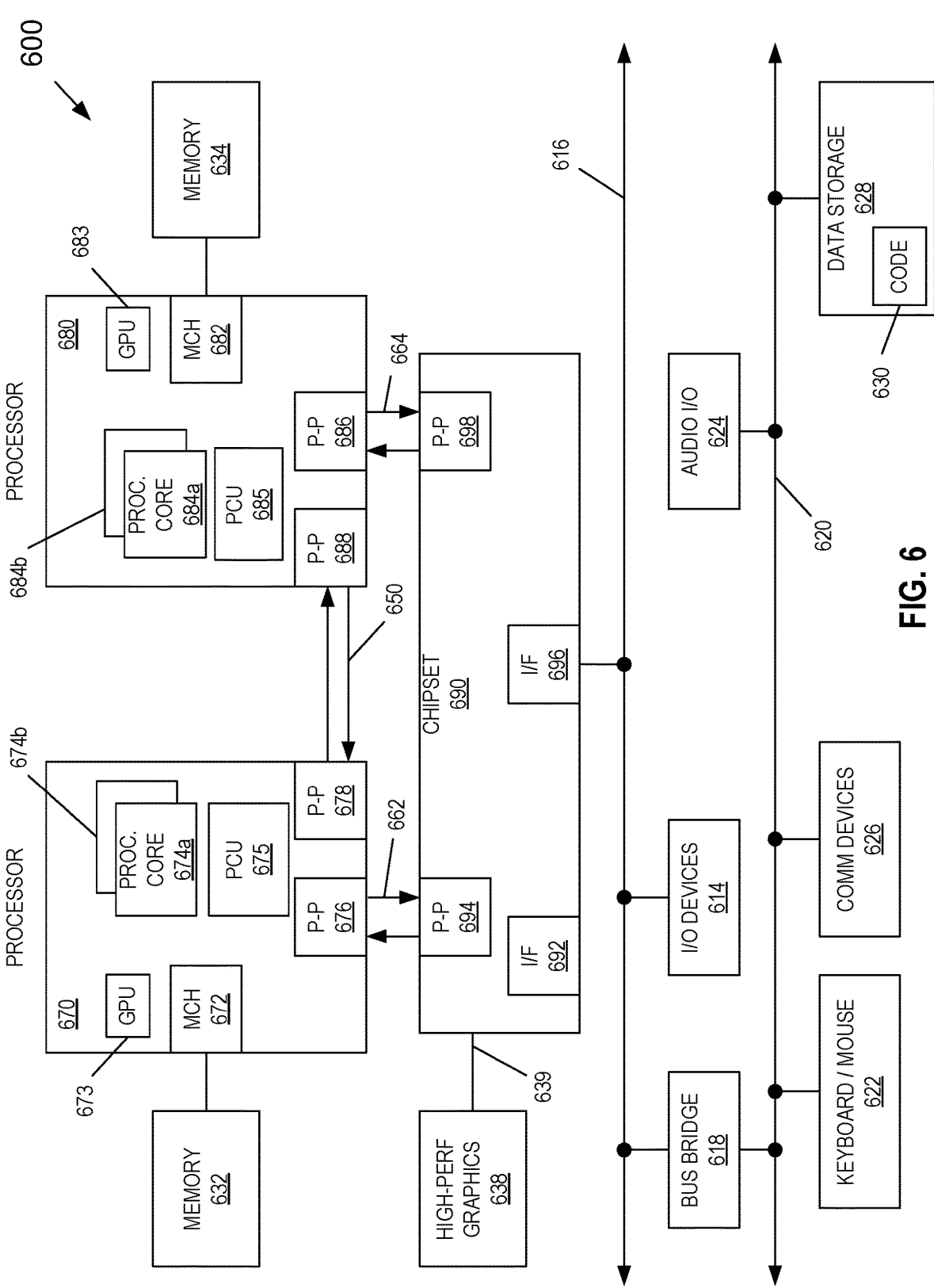
FIG. 6 is a block diagram of a system in accordance with another embodiment.

Embodiments may be implemented in other system types such as client or server systems. Referring now to FIG. 6, shown is a block diagram of a system in accordance with another embodiment. As shown in FIG. 6, multiprocessor system 600 is a point-to-point interconnect system, and includes a first processor 670 and a second processor 680 coupled via a point-to-point interconnect 650. As shown in FIG. 6, each of processors 670 and 680 may be multicore processors, including first and second processor cores (i.e., processors 674a and 674b and processor cores 684a and 684b), although potentially many more cores may be present in the processors. In addition, each of processors 670 and 680 also may include a graphics processor unit (GPU) 673, 683 to perform graphics operations. Each of the processors can include a power control unit (PCU) 675, 685 to perform processor-based power management.

Still referring to FIG. 6, first processor 670 further includes a memory controller hub (MCH) 672 and point-to-point (P-P) interfaces 676 and 678. Similarly, second processor 680 includes a MCH 682 and P-P interfaces 686 and 688. As shown in FIG. 6, MCH's 672 and 682 couple the processors to respective memories, namely a memory 632 and a memory 634, which may be portions of system memory (e.g., DRAM) locally attached to the respective processors. In embodiments herein, one or more packages may include multiple dies including at least processor 670 and memory 632 (e.g.), which may be stacked and configured as described herein.

First processor 670 and second processor 680 may be coupled to a chipset 690 via P-P interconnects 662 and 664, respectively. As shown in FIG. 6, chipset 690 includes P-P interfaces 694 and 698. Furthermore, chipset 690 includes an interface 692 to couple chipset 690 with a high performance graphics engine 638, by a P-P interconnect 639. In turn, chipset 690 may be coupled to a first bus 616 via an interface 696. As shown in FIG. 6, various input/output (I/O) devices 614 may be coupled to first bus 616, along with a bus bridge 618 which couples first bus 616 to a second bus 620. Various devices may be coupled to second bus 620 including, for example, a keyboard/mouse 622, communication devices 626 and a data storage unit 628 such as a disk drive or other mass storage device which may include code 630, in one embodiment. Further, an audio I/O 624 may be coupled to second bus 620.

Figure 7:
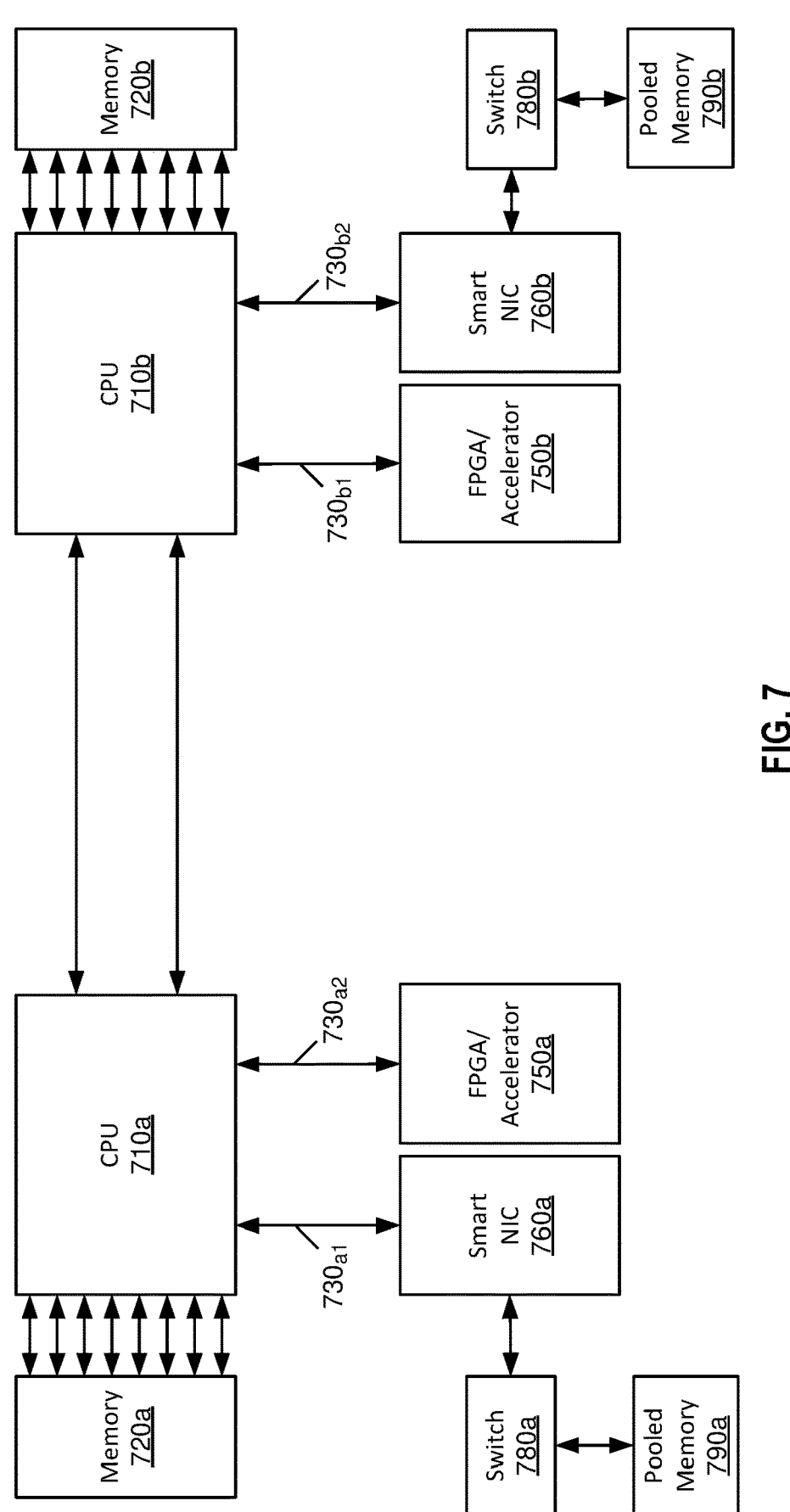
FIG. 7 is a block diagram of a system in accordance with another embodiment.

Referring now to FIG. 7, shown is a block diagram of a system 700 in accordance with another embodiment. As shown in FIG. 7, system 700 may be any type of computing device, and in one embodiment may be a datacenter system. In the embodiment of FIG. 7, system 700 includes multiple CPUs 710a,b that in turn couple to respective system memories 720a,b which in embodiments may be implemented as double data rate (DDR) memory, persistent or other types of memory. Note that CPUs 710 may couple together via an interconnect system 715 implementing a coherency protocol. In embodiments herein, one or more packages may include multiple dies including at least CPU 710 and system memory 720 (e.g.), which may be stacked and configured as described herein.

To enable coherent accelerator devices and/or smart adapter devices to couple to CPUs 710 by way of potentially multiple communication protocols, a plurality of interconnects 730a1-b2 may be present.

In the embodiment shown, respective CPUs 710 couple to corresponding field programmable gate arrays (FPGAs)/ accelerator devices 750a,b (which may include GPUs, in one embodiment). In addition CPUs 710 also couple to smart NIC devices 760a,b. In turn, smart NIC devices 760a,b couple to switches 780a,b that in turn couple to a pooled memory 790a,b such as a persistent memory.

Figure 8:
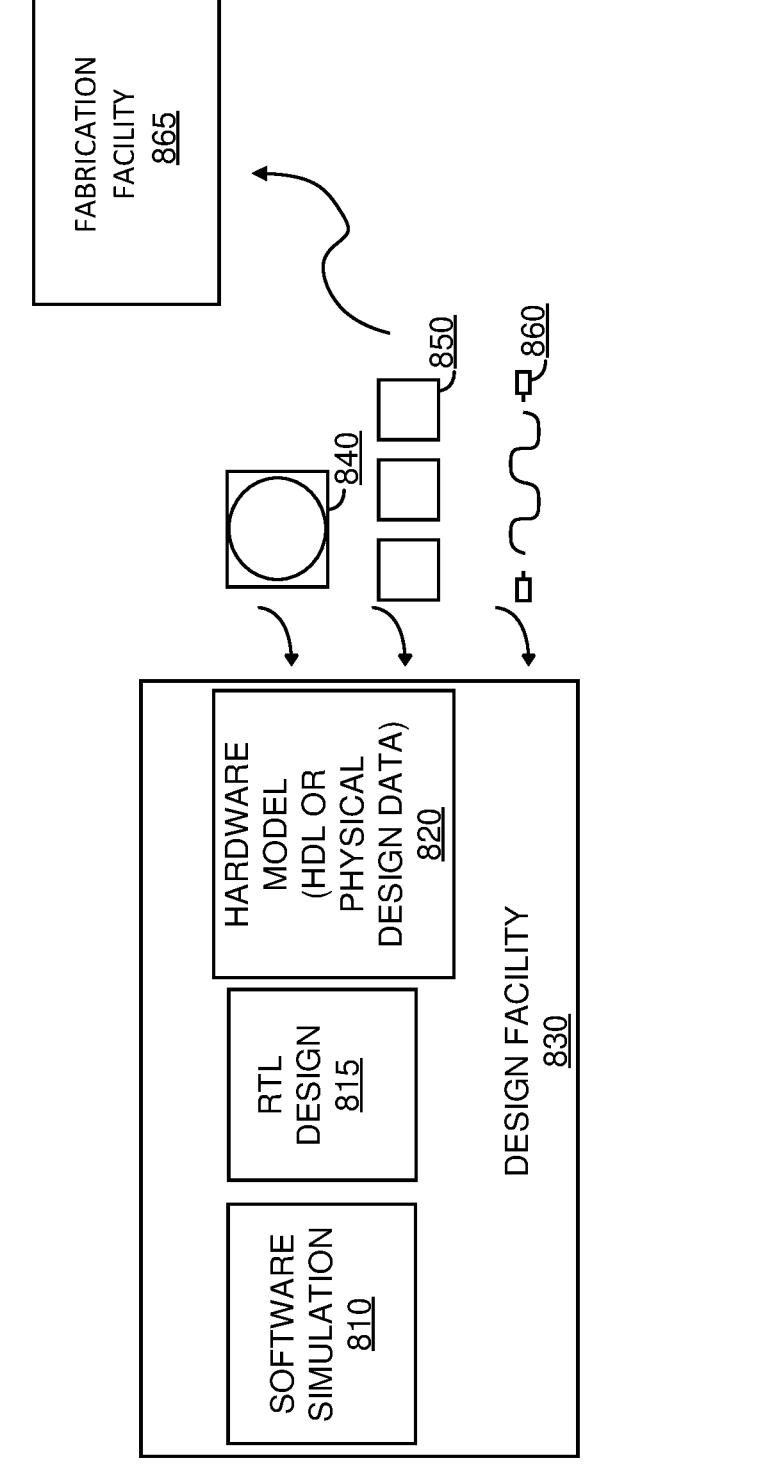
FIG. 8 is a block diagram illustrating an IP core development system used to manufacture an integrated circuit to perform operations according to an embodiment.

FIG. 8 is a block diagram illustrating an IP core development system 800 that may be used to manufacture integrated circuit dies that can in turn be stacked to realize multi-die packages according to an embodiment. The IP core development system 800 may be used to generate modular, re-usable designs that can be incorporated into a larger design or used to construct an entire integrated circuit (e.g., an SoC integrated circuit). A design facility 830 can generate a software simulation 810 of an IP core design in a high level programming language (e.g., C/C++). The software simulation 810 can be used to design, test, and verify the behavior of the IP core. A register transfer level (RTL) design can then be created or synthesized from the simulation model. The RTL design 815 is an abstraction of the behavior of the integrated circuit that models the flow of digital signals between hardware registers, including the associated logic performed using the modeled digital signals. In addition to an RTL design 815, lower-level designs at the logic level or transistor level may also be created, designed, or synthesized. Thus, the particular details of the initial design and simulation may vary.

The RTL design 815 or equivalent may be further synthesized by the design facility into a hardware model 820, which may be in a hardware description language (HDL), or some other representation of physical design data. The HDL may be further simulated or tested to verify the IP core design. The IP core design can be stored for delivery to a third party fabrication facility 865 using non-volatile memory 840 (e.g., hard disk, flash memory, or any non-volatile storage medium). Alternately, the IP core design may be transmitted (e.g., via the Internet) over a wired connection 850 or wireless connection 860. The fabrication facility 865 may then fabricate an integrated circuit that is based at least in part on the IP core design. The fabricated integrated circuit can be configured to be implemented in a package and perform operations in accordance with at least one embodiment described herein.

The following examples pertain to further embodiments.

In one example, an apparatus comprises: a first die adapted on a second die, and a third die adapted on the second die. The first die may have a plurality of cores, each of the plurality of cores associated with a first plurality of TSVs. The second die may comprise a DRAM having a plurality of local portions, each of the plurality of local portions associated with a second plurality of TSVs, where each of at least some of the plurality of cores are directly coupled to a corresponding local portion of the DRAM by the corresponding first and second plurality of TSVs. The third die may comprise interface circuitry.

In an example, the apparatus further comprises a fourth die adapted on the second die, the fourth die comprising a GPU having a plurality of graphics processing cores, each of the plurality of graphics processing cores associated with a fourth plurality of TSVs, where each of at least some of the plurality of graphics processing cores are directly coupled to a corresponding local portion of the DRAM by the corresponding fourth and second plurality of TSVs.

In an example, the apparatus further comprises a fifth die adapted on the second die, the fifth die comprising a memory controller to interface with an external memory.

In an example, the second die comprises a fabric to couple the first die and the third die.

In an example, the second die comprises a wafer-sized die having a plurality of stampings, each of the plurality of stampings comprising: the plurality of local portions; and a stitching fabric to provide interconnection between at least the first die and the third die.

In an example, the apparatus further comprises: a plurality of first dies adapted on the second die, each of the plurality of first dies having the plurality of cores; and a plurality of fourth dies adapted on the second die, at least some of the plurality of fourth dies comprising a processing unit having a plurality of specialized processing cores.

In an example, the apparatus further comprises another die, where the second die is adapted on the another die, the another die comprising a second DRAM, where the second DRAM comprises a system memory for a system in which the apparatus is included, and where at least a portion of the DRAM of the second die comprises one or more levels of a cache memory hierarchy, the apparatus comprising an integrated circuit package.

In an example, each of the at least some of the plurality of cores is to access only the corresponding local portion of the DRAM.

In an example, each of the plurality of local portions of the DRAM has a width of at least 1024 words.

In an example, the apparatus comprises an integrated circuit package having the first die and the second die, where the DRAM is to be a system memory for a system in which the integrated circuit package is included.

In an example, the second die comprises: a first layer having a first plurality of memory cells for each of the plurality of portions of the DRAM; and a second layer having a second plurality of memory cells for each of the plurality of portions of the DRAM.

In another example, an IC package comprises: a first die adapted on a second die, the first die having a plurality of cores, each of the plurality of cores associated with a first plurality of TSVs; the second die comprising a first DRAM having a plurality of local portions, each of the plurality of local portions associated with a second plurality of TSVs, where each of at least some of the plurality of cores are directly coupled to a corresponding local portion of the first DRAM by the corresponding first and second plurality of TSVs; and a third die on which the second die is adapted, the third die comprising a second DRAM, where the first DRAM comprises at least one level of a cache memory hierarchy and the second DRAM comprises a system memory.

In an example, the IC package further comprises a fourth die adapted on the second die, the fourth die comprising a XPU having a plurality of specialized processing cores, each of the plurality of specialized processing cores associated with a fourth plurality of TSVs, where each of at least some of the plurality of specialized processing cores are directly coupled to a corresponding local portion of the first DRAM by the corresponding fourth and second plurality of TSVs.

In an example, the IC package further comprises a plurality of fourth dies adapted on the second die, the XPU of at least one of the plurality of fourth dies comprising a GPU.

In an example, the second die further comprises an interconnection network to couple the first die and the fourth die.

In an example, at least one of the second die or the third die comprises a wafer-sized die.

In another example, an IC package comprises: a plurality of first dies adapted on a second die, each of the plurality of first dies having a plurality of cores, each of the plurality of cores associated with a first plurality of TSVs; and the second die comprising a plurality of stampings, each of the plurality of stampings comprising DRAM having a plurality of local portions, each of the plurality of local portions associated with a second plurality of TSVs, where each of at least some of the plurality of cores of the plurality of first dies are directly coupled to a corresponding local portion of the DRAM by the corresponding first and second plurality of TSVs, the second die being a wafer-sized die.

In an example, the IC package further comprises a plurality of third dies adapted on the second die, each of the plurality of third dies comprising a XPU having a plurality of specialized processing cores, each of the plurality of specialized processing cores associated with a third plurality of TSVs, where each of at least some of the plurality of specialized processing cores are directly coupled to a corresponding local portion of the DRAM by the corresponding third and second plurality of TSVs.

In an example, each of the plurality of stampings has at least one of the plurality of first dies and at least one of the plurality of third dies adapted thereon.

In an example, each of the plurality of stampings comprises an interconnection network to couple the at least one of the plurality of first dies with the at least one of the plurality of third dies.

In yet another example, an apparatus comprises: first die means adapted on second die means, and third die means adapted on the second die means. The first die means may have a plurality of core means, each of the plurality of core means associated with a first plurality of TSV means. The second die means may comprise DRAM means having a plurality of local portions, each of the plurality of local portions associated with a second plurality of TSV means, where each of at least some of the plurality of core means are directly coupled to a corresponding local portion of the DRAM means by the corresponding first and second plurality of TSV means. The third die means may comprise interface means.

In an example, the apparatus further comprises fourth die means adapted on the second die means, the fourth die means comprising GPU means having a plurality of graphics processing core means, each of the plurality of graphics processing core means associated with a fourth plurality of TSV means, where each of at least some of the plurality of graphics processing core means are directly coupled to a corresponding local portion of the DRAM means by the corresponding fourth and second plurality of TSV means.

In an example, the apparatus further comprises fifth die means adapted on the second die means, the fifth die means comprising memory control means for interfacing with an external memory means.

In an example, the second die means comprises fabric means for coupling the first die means and the third die means.

In an example, the second die means comprises a wafer-sized die means having a plurality of stampings, each of the plurality of stampings comprising: the plurality of local portions; and stitching fabric means for providing interconnection between at least the first die means and the third die means.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
a first die adapted on a second die, the first die having a plurality of cores and a first plurality of through silicon vias (TSVs), each of the plurality of cores associated with a respective plurality of TSVs of the first plurality of TSVs;
the second die comprising a dynamic random access memory (DRAM) having a plurality of local portions and a second plurality of TSVs, each of the plurality of local portions associated with a respective plurality of TSVs of the second plurality of TSVs, wherein each of at least some of the plurality of cores is directly coupled to a corresponding local portion of the DRAM by the corresponding respective pluralities of TSVs, and wherein each of the local portions comprises an independent memory channel; and
a third die adapted on the second die, the third die comprising interface circuitry, wherein the interface circuitry is to interface with at least one of integrated circuits and components of a system including the first die and the second die.

2. The apparatus of claim 1, further comprising a fourth die adapted on the second die, the fourth die comprising a graphics processing unit (GPU) having a plurality of graphics processing cores and a third plurality of TSVs, each of the plurality of graphics processing cores associated with a respective plurality of TSVs of the third plurality of TSVs, wherein each of at least some of the plurality of graphics processing cores are directly coupled to a corresponding local portion of the DRAM by the corresponding respective pluralities of TSVs.

3. The apparatus of claim 2, further comprising a fifth die adapted on the second die, the fifth die comprising a memory controller to interface with an external memory.

4. The apparatus of claim 1, where the second die comprises a fabric to couple the first die and the third die.

5. The apparatus of claim 1, wherein the second die comprises a wafer-sized die having a plurality of stampings, each of the plurality of stampings comprising:
the plurality of local portions; and
a stitching fabric to provide interconnection between at least the first die and the third die.

6. The apparatus of claim 5, further comprising:

a plurality of first dies adapted on the second die, each of the plurality of first dies having the plurality of cores; and a plurality of fourth dies adapted on the second die, at least some of the plurality of fourth dies comprising a processing unit having a plurality of specialized processing cores.

7. The apparatus of claim 1, further comprising another die, wherein the second die is adapted on the another die, the another die comprising a second DRAM, wherein the second DRAM comprises a system memory for a system in which the apparatus is included, and wherein at least a portion of the DRAM of the second die comprises one or more levels of a cache memory hierarchy, the apparatus comprising an integrated circuit package.

8. The apparatus of claim 1, wherein each of the at least some of the plurality of cores is to access only the corresponding local portion of the DRAM.

9. The apparatus of claim 1, wherein each of the plurality of local portions of the DRAM has a width of at least 1024 words.

10. The apparatus of claim 1, wherein the apparatus comprises an integrated circuit package having the first die and the second die, wherein the DRAM is to be a system memory for a system in which the integrated circuit package is included.

11. The apparatus of claim 1, wherein the second die comprises:

a first layer having a first plurality of memory cells for each of the plurality of portions of the DRAM; and a second layer having a second plurality of memory cells for each of the plurality of portions of the DRAM.

12. An integrated circuit (IC) package comprising:

a first die adapted on a second die, the first die having a plurality of cores and a first plurality of through silicon vias (TSVs), each of the plurality of cores associated with a respective plurality of TSVs of the first plurality of TSVs;

the second die comprising a dynamic random access memory (DRAM) having a plurality of local portions and a second plurality of TSVs, each of the plurality of local portions associated with a respective plurality of TSVs of the second plurality of TSVs, wherein each of at least some of the plurality of cores is directly coupled to a corresponding local portion of the DRAM by the corresponding respective pluralities of TSVs, and wherein each of the local portions comprises an independent memory channel; and a third die adapted on the second die, the third die having a third plurality of TSVs and comprising a system-on-a chip (SOC) comprising interface circuitry to interface with at least one of integrated circuits and components of a system including the first die and the second die.

13. The IC package of claim 12 wherein the first die is a processor having a plurality of processing cores and the third die is a graphics processing unit having a plurality of graphics processing cores, each of the plurality of graphics processing cores associated with a respective plurality of TSVs of the third plurality of TSVs, and wherein each of at least some of the plurality of graphics processing cores is directly coupled to a corresponding local portion of the DRAM by the corresponding respective pluralities of TSVs.

14. The IC package of claim 13 wherein the second die further comprises an interconnection network to couple the first die and the third die.

15. The IC package of claim 12, further comprising a fourth die adapted on the second die, the fourth die comprising a specialized processing unit (XPU) having a plurality of specialized processing cores and a fourth plurality of TSVs, each of the plurality of specialized processing cores associated with a respective plurality of TSVs of the fourth plurality of TSVs, and wherein each of at least some of the plurality of specialized processing cores are directly coupled to a corresponding local portion of the DRAM by the corresponding fourth and second plurality of TSVs.

16. The IC package of claim 12, wherein at least one of the second die or the third die comprises a wafer-sized die.

17. An integrated circuit (IC) package comprising:

a first processor die adapted on a second die, the first processor die having a plurality of processing cores and a first plurality of through silicon vias (TSVs), each of the plurality of processing cores associated with a respective plurality of TSVs of the first plurality of TSVs;

the second die comprising a dynamic random access memory (DRAM) having a plurality of local portions and a second plurality of TSVs, each of the plurality of local portions associated with a respective plurality of TSVs of the second plurality of TSVs, wherein each of at least some of the plurality of processing cores is directly coupled to a corresponding local portion of the DRAM by the corresponding respective pluralities of TSVs, and wherein each of the local portions comprises an independent memory channel; and a third die adapted on the second die, the third die having a third plurality of TSVs and comprising interface circuitry is to interface with at least one of integrated circuits and components of a system including the IC package, wherein the second die comprises an interconnection network to couple the first die and the third die.

18. The IC package of claim 17, wherein the second die comprises a wafer-sized die.

19. The IC package of claim 17, wherein the first processor die is one of a plurality of processor dies adapted on the second die, each of the plurality of processor dies having a plurality of processing cores, each of the plurality of processing cores associated with a respective plurality of TSVs of the first plurality of TSVs.

20. The IC package of claim 19, wherein the second die is a wafer-sized die comprising a plurality of stampings, each of the plurality of stampings comprising DRAM having a plurality of local portions, each of the plurality of local portions associated with a respective plurality of TSVs of the second plurality of TSVs, wherein each of at least some of the plurality of processing cores of at least some of the plurality of processor dies are directly coupled to a corresponding local portion of the DRAM by the corresponding first and second plurality of TSVs.

* * * * *